United States Patent
Honda et al.

(10) Patent No.: US 9,893,643 B1
(45) Date of Patent: Feb. 13, 2018

(54) SEMICONDUCTOR MODULE, SEMICONDUCTOR DEVICE, AND ELECTRIC POWER DEVICE

(71) Applicant: Mitsubishi Electric Corporation, Tokyo (JP)

(72) Inventors: Nobuhisa Honda, Tokyo (JP); Yasuo Kotake, Fukuoka (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/626,222

(22) Filed: Jun. 19, 2017

(30) Foreign Application Priority Data

Nov. 21, 2016 (JP) .................................. 2016-225707

(51) Int. Cl.
| | |
|---|---|
| *H05K 7/00* | (2006.01) |
| *H05K 5/00* | (2006.01) |
| *H02H 7/122* | (2006.01) |
| *H02M 7/00* | (2006.01) |
| *H02M 7/537* | (2006.01) |
| *H02M 1/34* | (2007.01) |
| *H01L 23/057* | (2006.01) |
| *H01L 25/07* | (2006.01) |
| *H01L 23/00* | (2006.01) |
| *H02P 27/06* | (2006.01) |

(52) U.S. Cl.
CPC .......... *H02M 7/003* (2013.01); *H01L 23/057* (2013.01); *H01L 24/73* (2013.01); *H01L 25/072* (2013.01); *H02M 1/34* (2013.01); *H02M 7/537* (2013.01); *H01L 2224/73265* (2013.01); *H01L 2924/1033* (2013.01); *H01L 2924/10254* (2013.01); *H01L 2924/10272* (2013.01); *H01L 2924/13055* (2013.01); *H01L 2924/13091* (2013.01); *H01L 2924/14252* (2013.01); *H02P 27/06* (2013.01)

(58) Field of Classification Search
CPC ..... H02M 2001/342; H02M 2001/344; H02M 1/34
USPC ................................ 361/728, 752; 363/56.12
See application file for complete search history.

(56) References Cited

U.S. PATENT DOCUMENTS

| | | | | |
|---|---|---|---|---|
| 3,718,841 A | * | 2/1973 | Frederick .............. | H01L 23/473 174/16.3 |
| 6,064,578 A | * | 5/2000 | Hashimoto ........... | H02M 7/003 363/16 |
| 2015/0078052 A1 | * | 3/2015 | Kobayashi ............ | H02M 7/487 363/131 |

FOREIGN PATENT DOCUMENTS

JP 2015-223047 A 12/2015

* cited by examiner

*Primary Examiner* — Gary Nash
(74) *Attorney, Agent, or Firm* — Studebaker & Brackett PC

(57) ABSTRACT

In a semiconductor module, at least one snubber circuit module is attachable/detachable to/from an interior communicated with a snubber-circuit-connecting opening; a plurality of snubber-circuit electrodes for electrically connecting with the at least one snubber circuit module are joined with a circuit pattern; the plurality of snubber-circuit electrodes are disposed in the interior of the snubber-circuit-connecting opening; in a state that the snubber circuit module is attached in the interior of the snubber-circuit-connecting opening, the snubber circuit module does not stick out from an outer surface of an outer enclosure member, the plurality of snubber-circuit electrodes are in surface-contact with electrodes in the side of the snubber circuit module, respectively; and the snubber-circuit-connecting opening and the interior are not overlapped with the at least one semiconductor element in a planar view.

10 Claims, 15 Drawing Sheets

F I G. 1 9
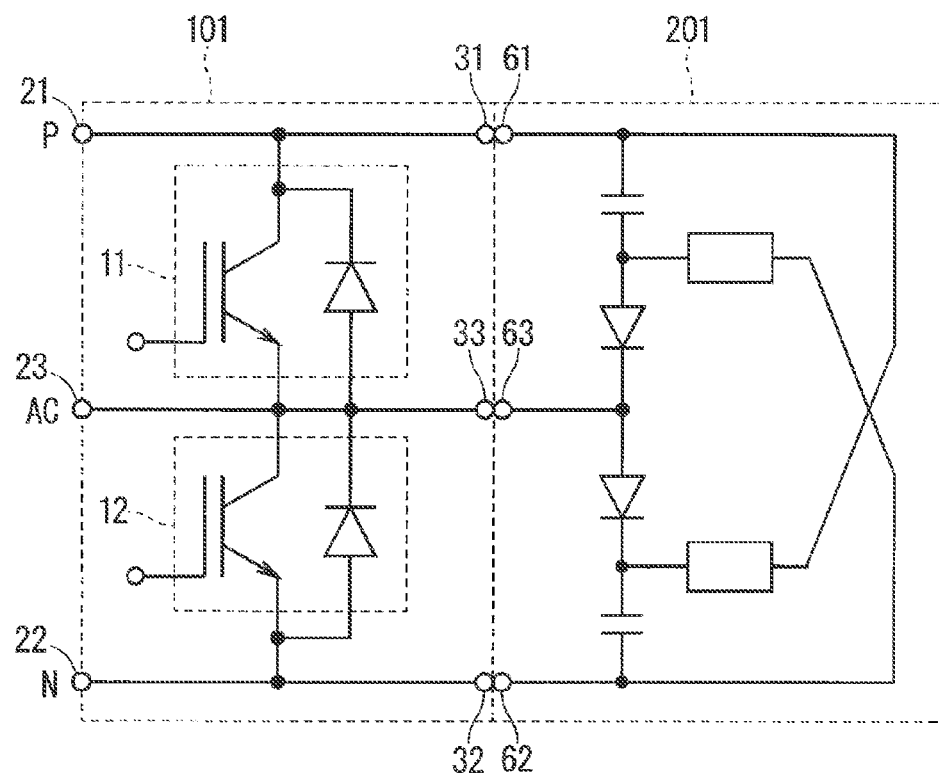
F I G. 2 0
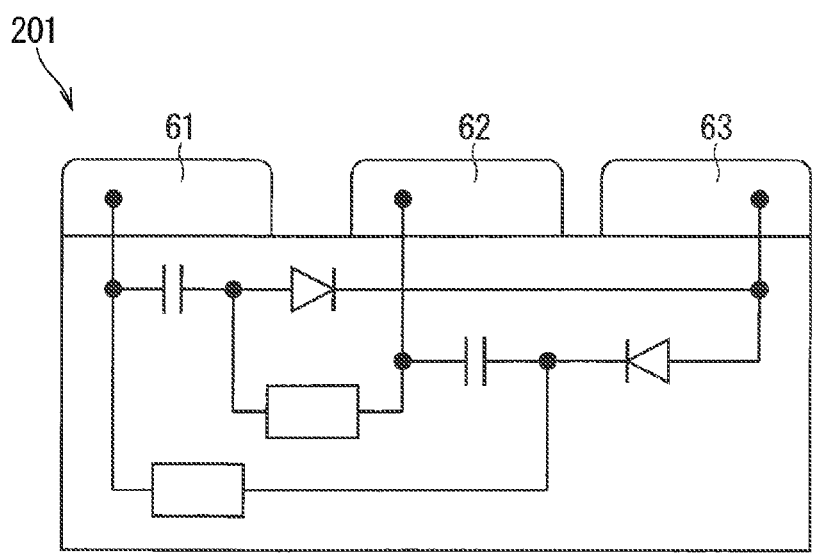

SEMICONDUCTOR MODULE, SEMICONDUCTOR DEVICE, AND ELECTRIC POWER DEVICE

BACKGROUND OF THE INVENTION

Field of the Invention

The present invention relates to semiconductor modules, semiconductor devices, and electric power devices.

Description of the Background Art

In a semiconductor module provided with semiconductor elements for switching, surge voltages are generated by switching operations of the semiconductor elements. Particularly when it is used for an electric power use, generation of the surge voltages by switching of large currents and high voltages is problematic. Therefore, a snubber circuit is connected to the semiconductor module in order to absorb the surge voltages.

Conventionally, the snubber circuit has been connected to the terminals, which are exposed from a package outer surface of the semiconductor module, by screw clamping or the like. Also, a technique for attaching the snubber circuit by providing the semiconductor module with snubber-circuit-dedicated terminals is known (see Japanese Patent Application Laid-Open No. 2015-223047).

In Japanese Patent Application Laid-Open No. 2015-223047, connection terminals of the snubber circuit are pin contacts, have high contact resistance, and large inductance; therefore, there has been a problem that the effect of suppressing the surge voltages is low. Therefore, it has been required to further increase the capacity of the snubber circuit. Also, it has been desired to further improve the effect of suppressing the surge voltages by connecting the snubber circuit more closely to the semiconductor elements provided in the semiconductor module.

SUMMARY OF THE INVENTION

It is an object of the present invention to provide a semiconductor module that electrically efficiently connects to a snubber circuit module and effectively suppresses surge voltages. It is another object of the present invention to provide a semiconductor device and an electric power device provided with this semiconductor module.

A semiconductor module according to the present invention is provided with: at least one semiconductor element; a circuit pattern disposed on a substrate and joined with a main electrode of the at least one semiconductor element; an outer enclosure member enclosing at least the at least one semiconductor element and a surface of the substrate in a side of the circuit pattern; and a snubber-circuit-connecting opening provided in an outer surface of the outer enclosure member. At least one snubber circuit module is attachable/detachable to/from an interior communicated with the snubber-circuit-connecting opening. A plurality of snubber-circuit electrodes for electrically connecting with the at least one snubber circuit module are joined with the circuit pattern. The plurality of snubber-circuit electrodes are disposed in the interior of the snubber-circuit-connecting opening. In a state that the snubber circuit module is attached in the interior of the snubber-circuit-connecting opening, the snubber circuit module does not stick out from an outer surface of the outer enclosure member. The plurality of snubber-circuit electrodes are in surface-contact with electrodes in the side of the snubber circuit module, respectively. The snubber-circuit opening and the interior are not overlapped with the at least one semiconductor element in a planar view.

According to the semiconductor module according to the present invention, the lengths of the snubber-circuit electrodes can be minimized. Since the snubber circuit module can be attached in the vicinity of the semiconductor elements as a result, inductance can be further reduced at the connecting part, and the effect of suppressing surge voltages is further improved. The plurality of snubber-circuit electrodes are brought into surface-contact with the electrodes in the side of the snubber circuit module, respectively. Therefore, in the connecting part, contact resistance and inductance can be further reduced, and the effect of suppressing the surge voltages is further improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a diagram showing a second example of the circuit configuration of the semiconductor module and the snubber circuit module according to the second preferred embodiment;

FIG. 20 is a diagram showing the second example of the circuit configuration of the snubber circuit module according to the second preferred embodiment;

DESCRIPTION OF THE PREFERRED EMBODIMENTS

First Preferred Embodiment

Figure 1:
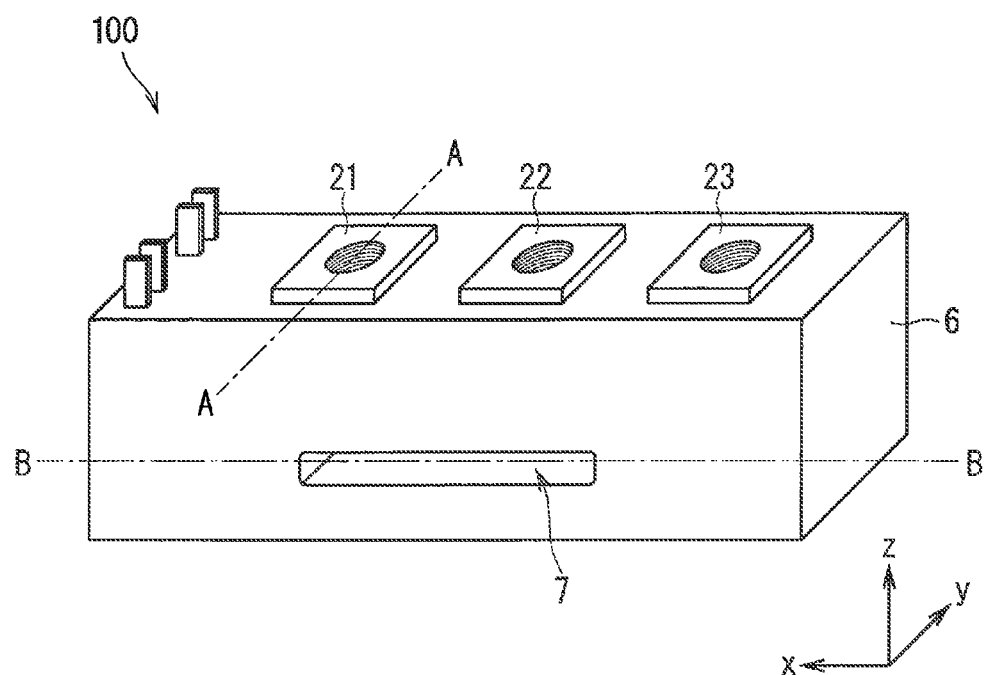
FIG. 1 is a perspective view of a semiconductor module according to a first preferred embodiment.
Figure 2:
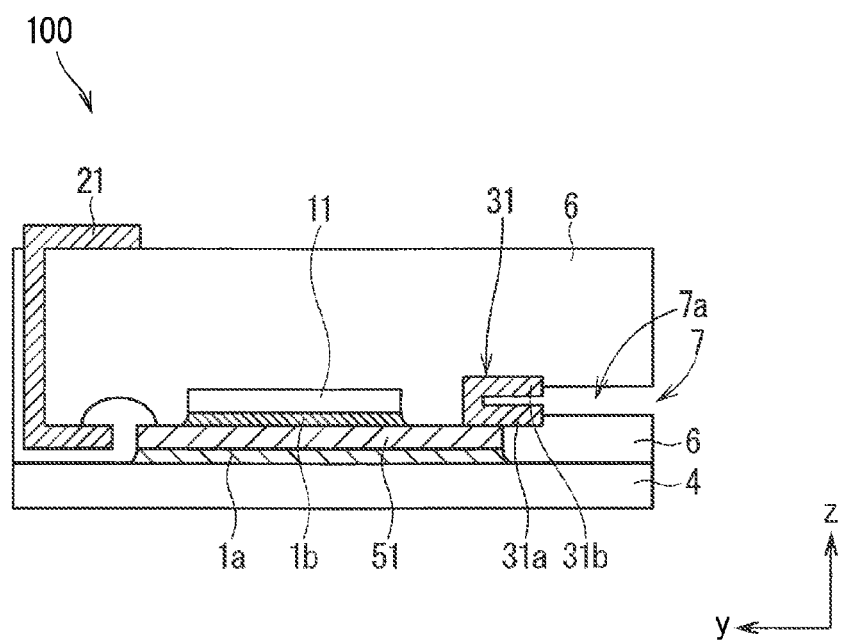
FIG. 2 is a cross-sectional view of the semiconductor module according to the first preferred embodiment along line segment A-A of FIG. 1.
Figure 3:
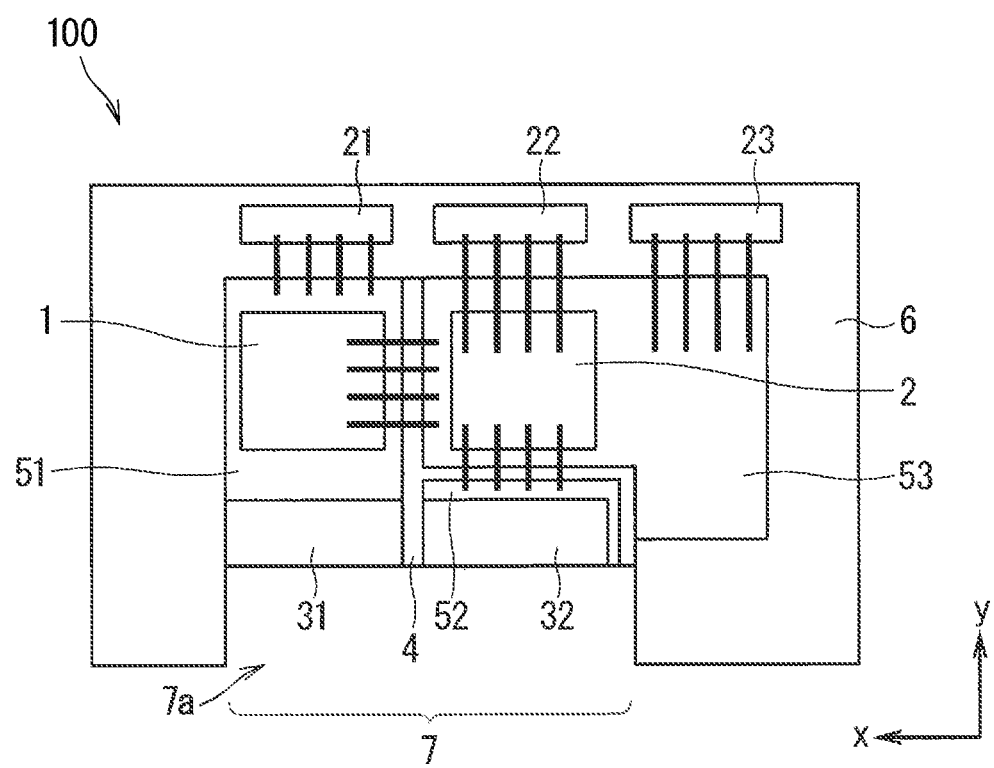
FIG. 3 is a cross-sectional view of the semiconductor module according to the first preferred embodiment along line segment B-B of FIG. 1.

FIG. 1 is a perspective view of a semiconductor module 100 of a present first preferred embodiment. FIG. 2 is a cross-sectional view of the semiconductor module 100 along line segment A-A in FIG. 1. FIG. 3 is a top view of the semiconductor module 100. In FIG. 3, illustration of part of an outer enclosure member 6 is omitted in order to facilitate understanding of the view.

The semiconductor module 100 in the present first preferred embodiment is provided with a plurality of semiconductor elements 11 and 12, a circuit pattern, an outer enclosure member 6, and a snubber-circuit-connecting opening 7. The semiconductor element 11 and the semiconductor element 12 are switching elements such as Insulated Gate Bipolar Transistor (IGBT), MOSFET, etc. A first main electrode (for example, an emitter electrode) is provided on an upper surface (surface in the +z direction side) of each of the semiconductor elements 11 and 12, and a second main electrode (for example, a collector electrode) is provided on a lower surface (surface in the −z direction side) thereof. The semiconductor element 11 and the semiconductor element 12 are connected to each other in series via the circuit pattern and wires.

The circuit pattern is joined with a principal surface (in other words, the surface in the z-direction side) of an insulating substrate 4 by solder 1a. The circuit pattern includes first, second, and third circuit patterns 51, 52, and 53, which are separated from one another. The second main electrode of the semiconductor element 11 is joined with the first circuit pattern 51 by solder 1b. The first main electrode of the semiconductor element 12 is connected to the third circuit pattern 53 by solder 1b. The first main electrode of the semiconductor element 11 and the third circuit pattern 53 are electrically connected via wires. The first main electrode of the semiconductor element 12 and the second circuit pattern 52 are electrically connected via wires.

The semiconductor module 100 is provided with a P terminal 21, an N terminal 22, and an AC terminal 23 as main-electrode terminals. The P terminal 21 is electrically connected to the first circuit pattern 51 via wires. The N terminal 22 is electrically connected to the first main electrode of the semiconductor element 12 via wires. The AC terminal 23 is electrically connected to the third circuit pattern 53 via wires.

The outer enclosure member 6 encloses the semiconductor elements 11 and 12 and the surface of the side on which the circuit patterns of the substrate 4 are provided. The outer enclosure member 6 is, for example, insulating resin. Distal-end parts of the P terminal 21, the N terminal 22, and the AC terminal 23 are exposed from the outer enclosure member 6. The distal-end parts of the terminals may be provided with screw holes for connection with external wiring.

The snubber-circuit-connecting opening 7 is provided on an outer surface of the outer enclosure member 6. In the present first preferred embodiment, the snubber-circuit-connecting opening 7 is provided on a lateral surface with respect to the principal surface of the substrate 4 among the outer surfaces of the outer enclosure member 6. Herein, the lateral surface of the outer enclosure member 6 is a surface perpendicular to a y-direction among the outer surfaces of the outer enclosure member 6. A snubber circuit module 200 is attachable/detachable to/from an interior 7a communicated with the snubber-circuit-connecting opening 7. The snubber circuit module 200 will be described later.

The semiconductor module 100 is provided with a plurality of snubber-circuit electrodes. The plurality of snubber-circuit electrodes include a snubber-circuit P electrode 31 and a snubber-circuit N electrode 32. The snubber-circuit P electrode 31 is joined with the first circuit pattern 51, for example, by solder. The snubber-circuit N electrode 32 is joined with the second circuit pattern 52, for example, by solder. The snubber-circuit P electrode 31 and the snubber-circuit N electrode 32 are disposed in the interior 7a of the snubber-circuit-connecting opening 7.

Figure 4:
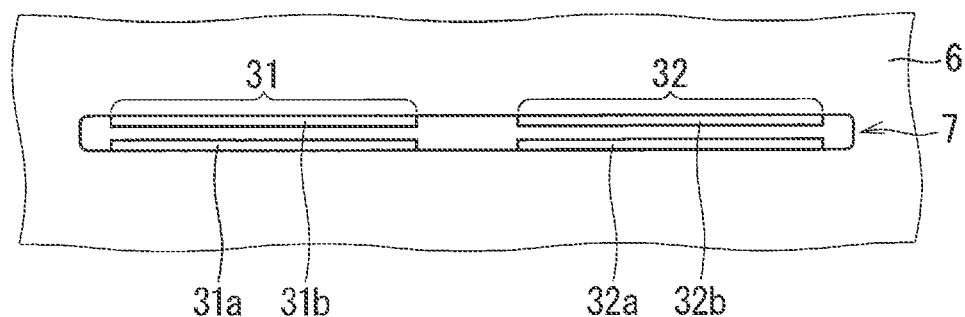
FIG. 4 is a front view of a snubber-circuit-connecting opening of the semiconductor module according to the first preferred embodiment.

FIG. 4 is a front view of the snubber-circuit-connecting opening 7. As shown in FIG. 4, a terminal part of the snubber-circuit P electrode 31 has two metal plates 31a and 31b, which are stacked with an interval provided therebetween. Similarly, a terminal part of the snubber-circuit N electrode 32 has two metal plates 32a and 32b, which are stacked with an interval provided therebetween. The cross-sectional shape of the snubber-circuit N electrode 32 is similar to the cross-sectional shape of the snubber-circuit P electrode 31.

As shown in FIG. 2 and FIG. 3, the snubber-circuit-connecting opening 7 and the interior 7a, which is communicated with the snubber-circuit-connecting opening 7, are disposed at the positions not overlapped with the semiconductor elements 11 and 12 in a planar view. The snubber-circuit-connecting opening 7 and the interior 7a are disposed at the positions not overlapped with the wires, which are disposed in the semiconductor module, in the planar view.

Thus, the snubber-circuit connecting opening 7 and the interior 7a are preferred to be disposed at the positions not overlapped with the circuit patterns and the members other than the snubber-circuit electrodes in the planar view.

<Snubber Circuit Module>

Figure 5:
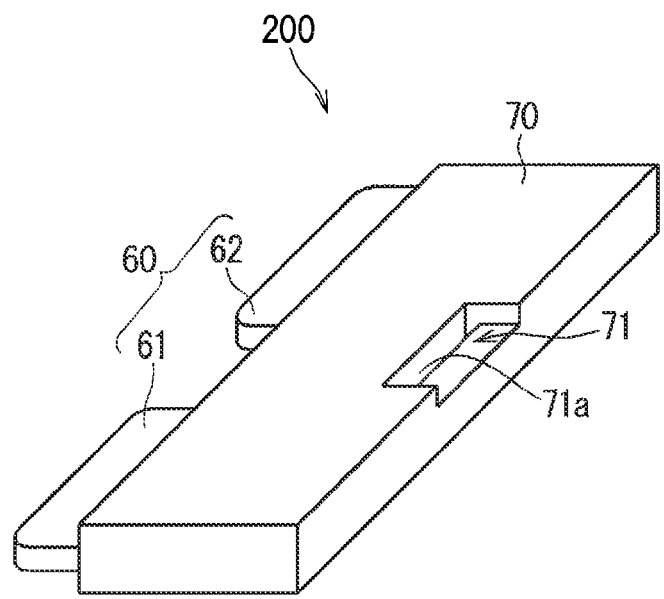
FIG. 5 is a perspective view of a snubber circuit module according to the first preferred embodiment.

FIG. 5 is a perspective view of the snubber circuit module 200 in the present first preferred embodiment. The snubber circuit module 200 is provided with an electrode terminal part 60 and a main body part 70. A snubber circuit is built in the main body part 70. The electrode terminal part 60 is provided with a P electrode terminal 61 and an N electrode terminal 62.

The thickness of the P electrode terminal 61 of the snubber circuit module 200 is designed to match the interval between the metal plates 31a and 31b of the snubber-circuit P electrode 31. Similarly, the thickness of the N electrode terminal 62 of the snubber circuit module 200 is designed to match the interval between the metal plates 32a and 32b of the snubber-circuit N electrode 32.

The length (in other words, y-direction length) of the snubber circuit module 200 is designed so that the snubber circuit module 200 does not stick out from the outer surface of the outer enclosure member 6 in a state in which the snubber circuit module 200 is attached to the interior 7a, which is communicated with the snubber-circuit-connecting opening 7. The width (in other words, x-direction length) of the snubber circuit module 200 is designed to be equal to or less than the width of the snubber-circuit-connecting opening 7.

Figure 6:
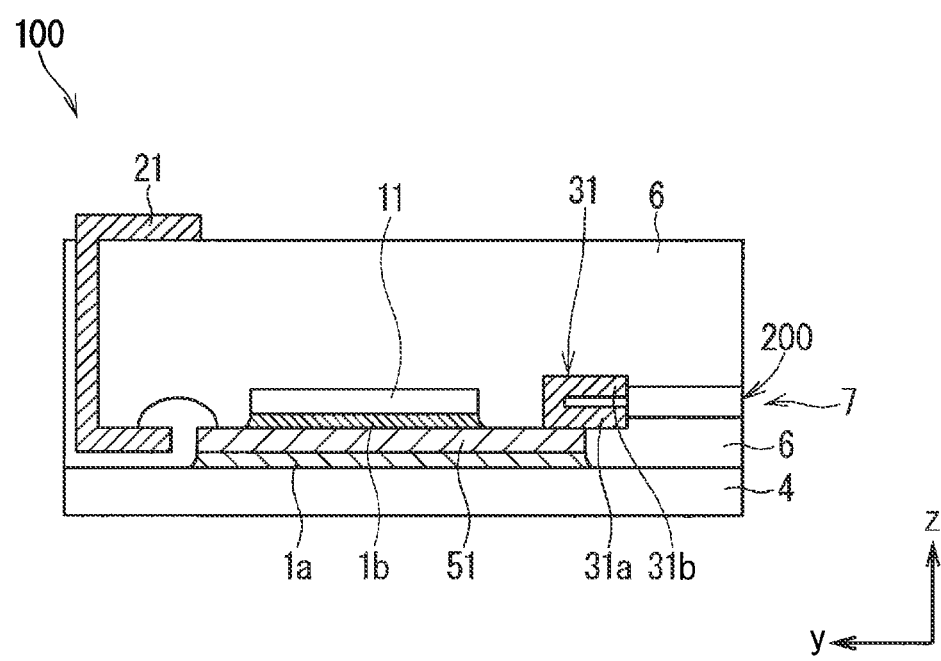
FIG. 6 is a cross-sectional view of a state in which the snubber circuit module of the semiconductor module according to the first preferred embodiment is attached.

FIG. 6 is a cross-sectional view of the semiconductor module 100 in a state in which the snubber circuit module 200 is attached. The snubber circuit module 200 is attached by being pushed into the snubber-circuit-connecting opening 7 of the semiconductor module 100. As shown in FIG. 6, the P electrode terminal 61 of the snubber circuit module 200 is inserted between the metal plates 31a and 31b, which are opposite to each other in the snubber-circuit P electrode 31, and is brought into surface-contact with each of the metal plates 31a and 31b. Similarly, the N electrode terminal 62 of the snubber circuit module 200 is inserted between the metal plates 32a and 32b, which are opposite to each other in the snubber-circuit N electrode 32, and is brought into surface contact with each of the metal plates 32a and 32b.

As shown in FIG. 6, in the state in which the snubber circuit module 200 is attached to the interior 7a, which is communicated with the snubber-circuit-connecting opening 7, the snubber circuit module 200 does not stick out from the outer surface of the outer enclosure member 6. The outer surface of the attached snubber circuit module 200 may be disposed in the same plane as the outer surface of the outer enclosure member 6.

When the snubber circuit module 200 is to be detached from the semiconductor module 100, a user causes a claw of a detaching tool to catch a groove 71a of a cutout 71, which is provided on a main body part 70 of the snubber circuit module 200, and pulls it out from the snubber-circuit-connecting opening 7. Alternatively, the cutout 71 per se may be pinched and pulled out with the fingers of the user or a tool.

Note that, even in a state in which the snubber circuit module 200 is not attached to the semiconductor module 100, the semiconductor module 100 can be operated.

Figure 7:
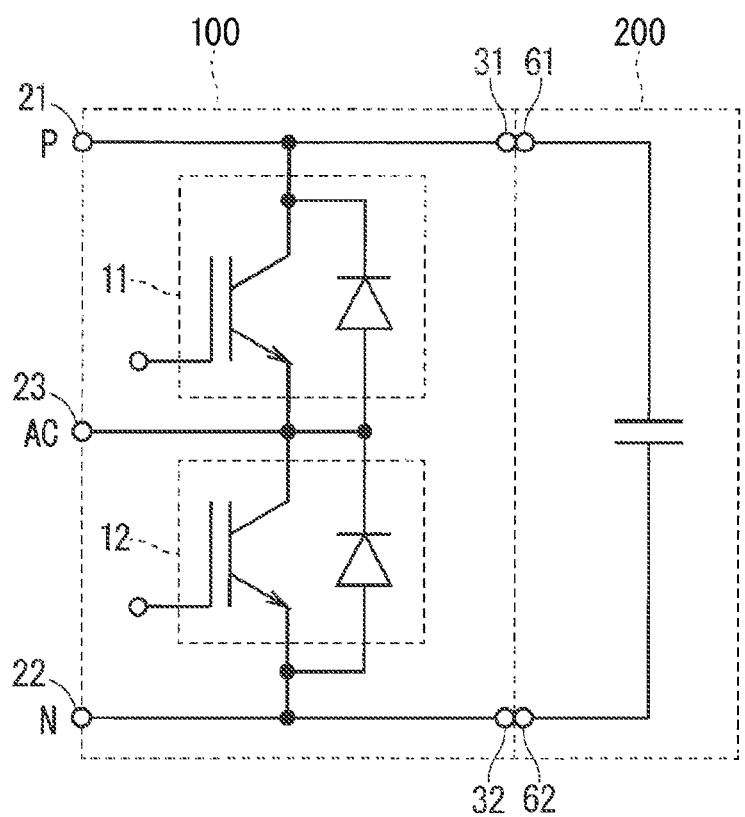
FIG. 7 is a diagram showing a circuit configuration of the semiconductor module and the snubber circuit module according to the first preferred embodiment.
Figure 8:
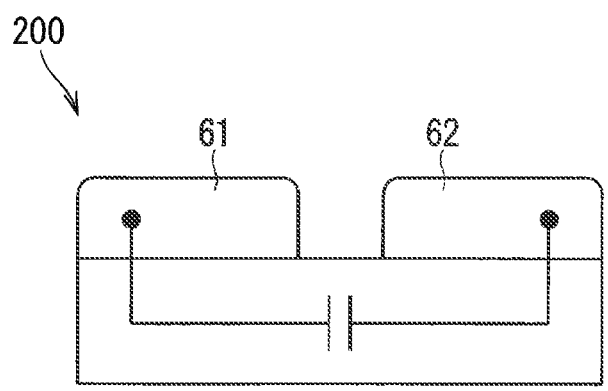
FIG. 8 is a diagram showing a circuit configuration of the snubber circuit module according to the first preferred embodiment.

FIG. 7 is a diagram showing a circuit diagram of the semiconductor module 100 and the snubber circuit module 200. FIG. 8 is a diagram showing a circuit configuration of the snubber circuit module 200. As shown in FIG. 7, in the semiconductor module 100, the semiconductor elements 11 and 12 serving as the switching elements in which free-wheeling diodes are built are connected in series. The P terminal 21 and the snubber-circuit P electrode 31 are electrically connected to each other, and the N terminal 22 and the snubber-circuit N electrode 32 are electrically connected to each other. In the snubber circuit module 200, a capacitor is connected between the P electrode terminal 61 and the N electrode terminal 62.

Note that the configuration of the snubber circuit of the snubber circuit module 200 is not limited to that of FIG. 8, and the snubber circuit may include a resistive element, a diode, etc. other than the capacitor. Also, a plurality of snubber circuit modules 200 of snubber circuits having different configurations may be prepared, and the snubber circuit module 200 to be attached to the semiconductor module 100 may be appropriately selected and attached depending on the characteristics of the magnitude, etc. of the surge voltage to be generated.

<Effects>

The semiconductor module 100 in the present first preferred embodiment is provided with: at least one semiconductor element (more specifically, the semiconductor element 11, 12); circuit patterns (more specifically, the first, second, third circuit patterns 51, 52, 53) disposed on the substrate 4 and joined with a main electrode of the at least one semiconductor element; the outer enclosure member 6 enclosing at least the at least one semiconductor element and the surface in the side of the circuit patterns of the substrate 4; and the snubber-circuit-connecting opening 7 provided in the outer surface of the outer enclosure member 6. The at least one snubber circuit module 200 is attachable/detachable to/from the interior 7a communicated with the snubber-circuit-connecting opening 7. A plurality of snubber-circuit electrodes (more specifically, the snubber-circuit P electrode 31 and the snubber-circuit N electrode 32) for electrically connecting with the at least one snubber circuit module 200 are joined with the circuit patterns. The plurality of snubber-circuit electrodes are disposed in the interior 7a of the snubber-circuit-connecting opening 7. In a state in which the snubber circuit module 200 is attached to the interior 7a of the snubber-circuit-connecting opening 7, the snubber circuit module 200 does not stick out from the outer surface of the outer enclosure member, the plurality of snubber-circuit electrodes are brought into surface contact with the electrodes in the side of the snubber circuit module 200, respectively, and the snubber-circuit-connecting opening 7 and the interior 7a are not overlapped with the at least one semiconductor element in the planar view.

If the snubber-circuit-connecting opening 7 and the interior 7a are overlapped with the semiconductor elements 11 and 12, the connecting wires, etc. in the planar view, the snubber-circuit electrodes (more specifically, the snubber-circuit P electrode 31 and the snubber-circuit N electrode 32) have to be designed to be long in order to avoid contact with the semiconductor elements and the wires. On the other hand, in the present first preferred embodiment, the snubber-circuit-connecting opening 7 and the interior 7a are not overlapped with the semiconductor elements 11 and 12 in the planar view; therefore, the length of the snubber-circuit electrodes can be minimized. As a result, the snubber circuit module 200 can be attached in the vicinity of the semiconductor elements 11 and 12; therefore, inductance can be further reduced in the connecting part, and the effect of suppressing surge voltages is further improved.

In the semiconductor module 100 in the present first preferred embodiment, the plurality of snubber-circuit electrodes are brought into surface-contact with the electrodes in the side of the snubber circuit module 200, respectively. Therefore, in the connecting part, contact resistance and inductance can be further reduced, and the effect of suppressing surge voltages is further improved.

In the semiconductor module 100 in the present first preferred embodiment, in the state in which the snubber circuit module 200 is attached to the interior 7a of the snubber-circuit-connecting opening 7, the snubber circuit module 200 does not stick out from the outer surface of the outer enclosure member 6. Therefore, when another devices, etc. are disposed around the semiconductor module 100, interference of the snubber circuit module 200 with the devices, etc. therearound can be avoided.

In the semiconductor module 100 in the present first preferred embodiment, the snubber-circuit-connecting opening 7 is provided in the lateral surface with respect to the principal surface of the substrate 4 among the outer surfaces of the outer enclosure member 6. Therefore, even when another devices, etc. are disposed in the upper surface side of the semiconductor module 100, the snubber circuit module 200 can be attached/detached to/from the lateral surface of the semiconductor module 100.

In the semiconductor module 100 of the present first preferred embodiment, each of the terminal parts of the plurality of snubber-circuit electrodes (more specifically, the snubber-circuit P electrode 31 and the snubber-circuit N electrode 32) has the plurality of metal plates 31a and 31b (or the metal plates 32a and 32b) stacked with the interval provided therebetween, and the electrode terminals (more specifically, the P electrode terminal 61 and the N electrode terminal 62) in the side of the snubber circuit module 200 are inserted between the plurality of metal plates and brought into surface-contact.

Therefore, each of the terminal parts of the snubber-circuit electrodes is formed by the metal plates stacked with the interval provided therebetween so that the electrode terminal in the side of the snubber circuit module 200 can be inserted between the metal plates and brought into surface-contact.

In the semiconductor module 100 in the present first preferred embodiment, the at least one semiconductor element includes two semiconductor elements (more specifically, the semiconductor elements 11, 12) connected in series, and the plurality of snubber-circuit electrodes include the snubber-circuit P electrode 31 corresponding to the P terminal of the two semiconductor elements connected in series and the snubber-circuit N electrode 32 corresponding to the N terminal of the two semiconductor elements connected in series. Therefore, the snubber circuit can be connected between the P terminal and the N terminal of the semiconductor module 100.

The semiconductor device in the present first preferred embodiment is provided with the semiconductor module 100 and the snubber circuit module 200, which can be attached/detached to/from the snubber-circuit-connecting opening 7 of the semiconductor module 100. Therefore, since the snubber circuit module 200 can be attached in the vicinity of the semiconductor element 11 of the semiconductor module 100, the effect of suppressing surge voltages in the semiconductor device is further improved.

In the semiconductor device in the present first preferred embodiment, the cutout 71 is provided on the exterior 70 of the snubber circuit module 200, and the cutout 71 is utilized when the snubber circuit module 200 is to be pulled out from the snubber-circuit-connecting opening 7. Therefore, the operation of detaching the snubber circuit module 200 from the semiconductor module 100 becomes easy.

Modification Example of First Preferred Embodiment

Figure 9:
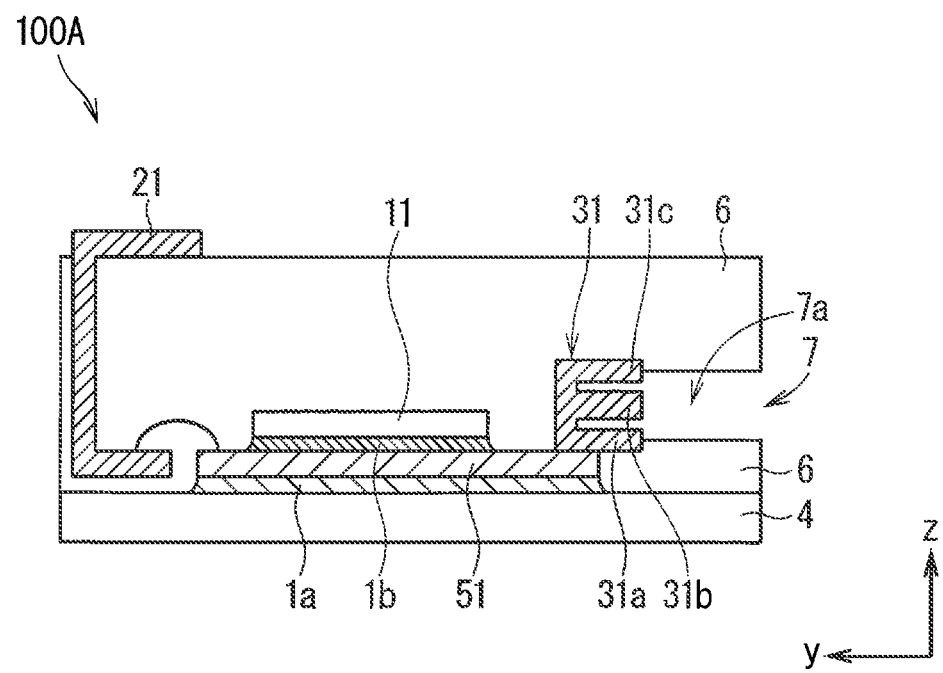
FIG. 9 is a cross-sectional view of a semiconductor module according to a modification example of the first preferred embodiment.
Figure 10:
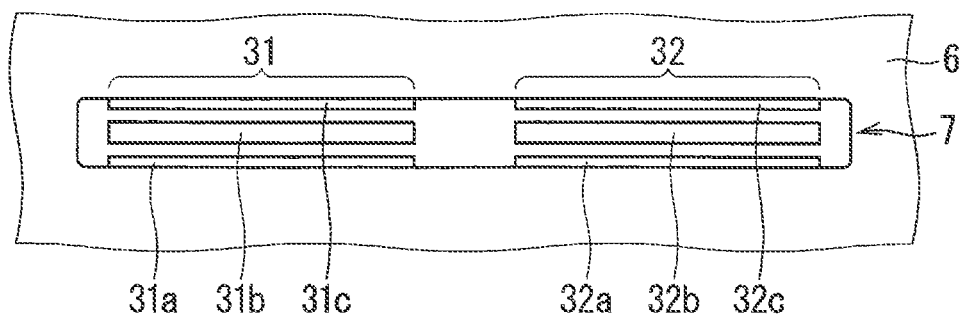
FIG. 10 is a front view of a snubber-circuit-connecting opening of the semiconductor module according to the modification example of the first preferred embodiment.

FIG. 9 is a cross-sectional view of a semiconductor module 100A in a modification example of the first preferred embodiment. FIG. 10 is a front view of a snubber-circuit-connecting opening 7 of the semiconductor module 100A. In the semiconductor module 100, the single snubber circuit module 200 can be attached. On the other hand, in the semiconductor module 100A, two snubber circuit modules 200 can be attached.

In the semiconductor module 100A, the terminal part of a snubber-circuit P electrode 31 has three metal plates 31a, 31b, and 31c stacked with intervals provided therebetween. Similarly, the terminal part of a snubber-circuit N electrode 32 has three metal plates 32a, 32b, and 32c stacked with intervals provided therebetween. Since the other configurations of the semiconductor module 100A are the same as those of the semiconductor module 100, the description thereof will be omitted.

Figure 11:
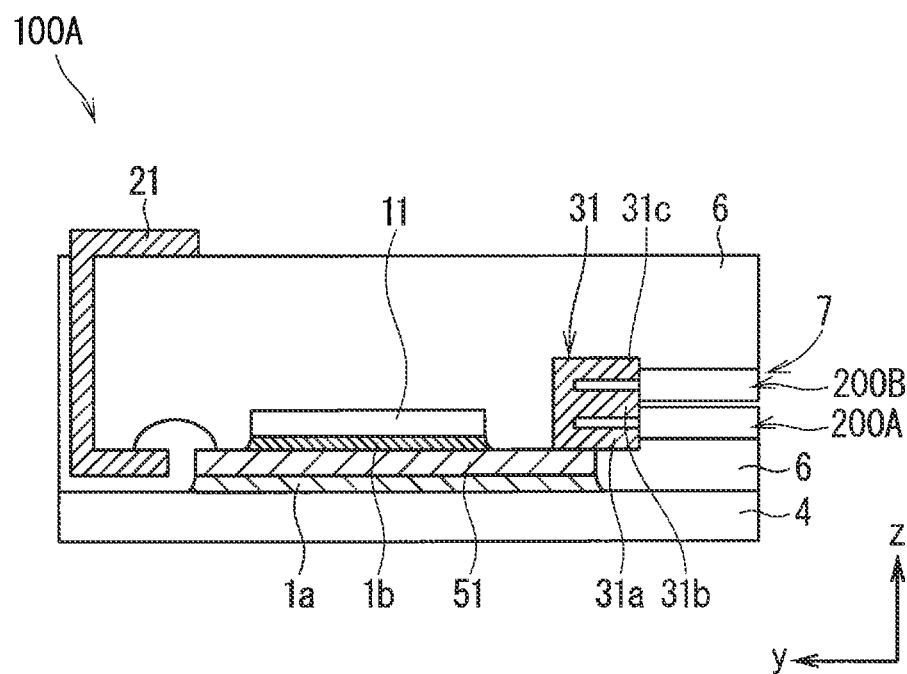
FIG. 11 is a cross-sectional view in a state in which two snubber circuit modules of the semiconductor module according to the modification example of the first preferred embodiment is attached.

FIG. 11 is a cross-sectional view of the semiconductor module 100A in a state in which the two snubber circuit modules 200 are attached. Note that, in order to distinguish the two snubber circuit modules 200 for the sake of description, they are described as snubber circuit modules 200A and 200B.

As shown in FIG. 11, a P electrode terminal 61 of the snubber circuit module 200A is inserted between the metal plates 31a and 31b, which are opposite to each other in the snubber-circuit P electrode 31, and is brought into surface-contact with each of the metal plates 31a and 31b. A P electrode terminal 61 of the snubber circuit module 200B is inserted between the metal plates 31b and 31 c, which are opposite to each other in the snubber-circuit P electrode 31, and is brought into surface contact with each of the metal plates 31b and 31c.

Similarly, an N electrode terminal 62 of the snubber circuit module 200A is inserted between the metal plates 32a and 32b, which are opposite to each other in the snubber-circuit N electrode 32, and is brought into surface-contact with each of the metal plates 32a and 32b. An N electrode terminal 62 of the snubber circuit module 200B is inserted between the metal plates 32b and 32c, which are opposite to each other in the snubber-circuit N electrode 32, and is brought into surface-contact with each of the metal plates 32b and 32c.

As shown in FIG. 11, in the state in which the two snubber circuit modules 200A, 200B are attached to the interior 7a communicated with the snubber-circuit-connecting opening 7, the snubber circuit modules 200A and 200B do not stick out from the outer surface of the outer enclosure member 6.

Figure 12:
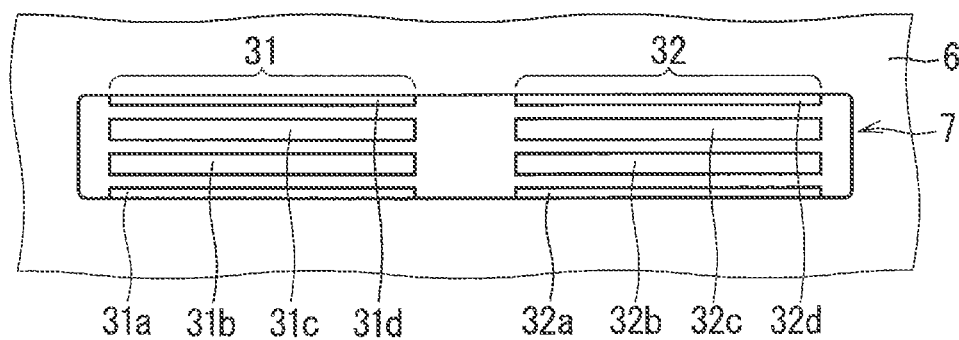
FIG. 12 is a front view of a snubber-circuit-connecting opening of a semiconductor module according to another modification example of the first preferred embodiment.

FIG. 12 is a front view of a snubber-circuit-connecting opening 7 of a semiconductor module 100A in another modification example of the first preferred embodiment. As shown in FIG. 12, the terminal part of a snubber-circuit P electrode 31 has four metal plates 31a, 31b, 31c, and 32c stacked with intervals provided therebetween. Similarly, the terminal part of a snubber-circuit N electrode 32 has four metal plates 32a, 32b, 32c, and 32d stacked with intervals provided therebetween. By virtue of the configuration shown in FIG. 12, a plurality of, i.e. three snubber circuit modules 200 can be attached to the snubber-circuit-connecting opening 7 at the same time.

In this manner, by increasing the number of the metal plates of the terminal part of the snubber-circuit P electrode 31 and the terminal part of the snubber-circuit P electrode 32, the number of the snubber circuit modules 200 which can be attached to the snubber-circuit-connecting opening 7 at the same time can be increased.

Note that the configurations of the snubber circuits of the plurality of snubber circuit modules 200 which are attached to the snubber-circuit-connecting opening 7 at the same time may be mutually different.

<Effects>

In the semiconductor module 100A in the modification examples of the first preferred embodiment, the plurality of snubber circuit modules 200 can be attached to the snubber-circuit-connecting opening 7 at the same time, and the plurality of snubber circuit modules 200 are connected in parallel mutually with respect to the plurality of snubber-circuit electrodes (more specifically, the snubber-circuit P electrode 31 and the snubber-circuit N electrode 32).

Therefore, in the semiconductor modules 100A in the modification examples of the first preferred embodiment, since the plurality of snubber circuit modules 200 can be attached in parallel, surge voltages can be further suppressed.

Second Preferred Embodiment

Figure 13:
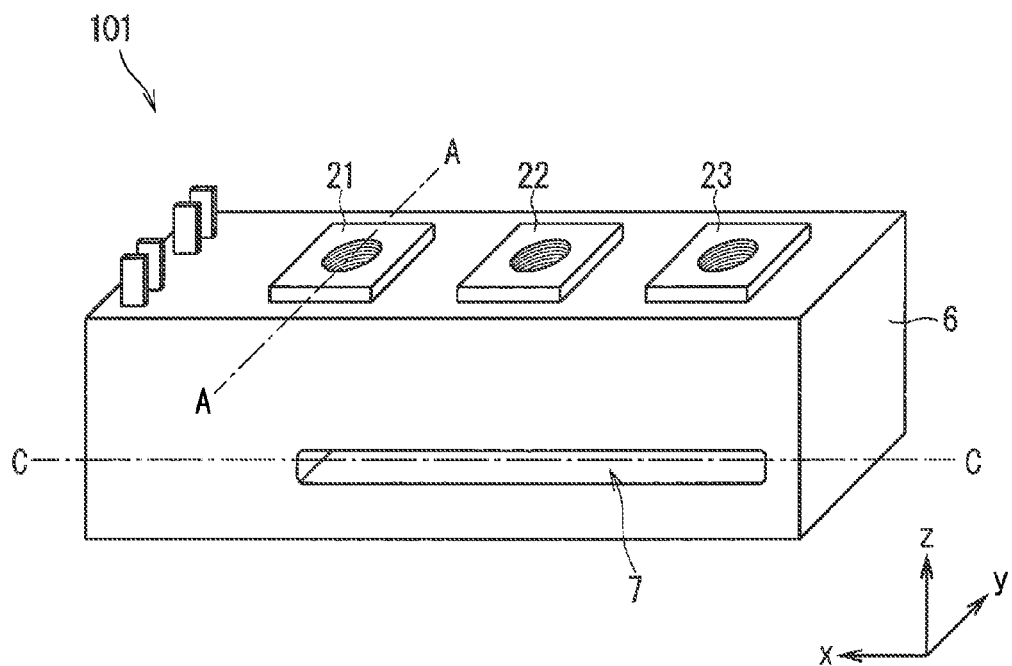
FIG. 13 is a perspective view of a semiconductor module according to a second preferred embodiment.
Figure 14:
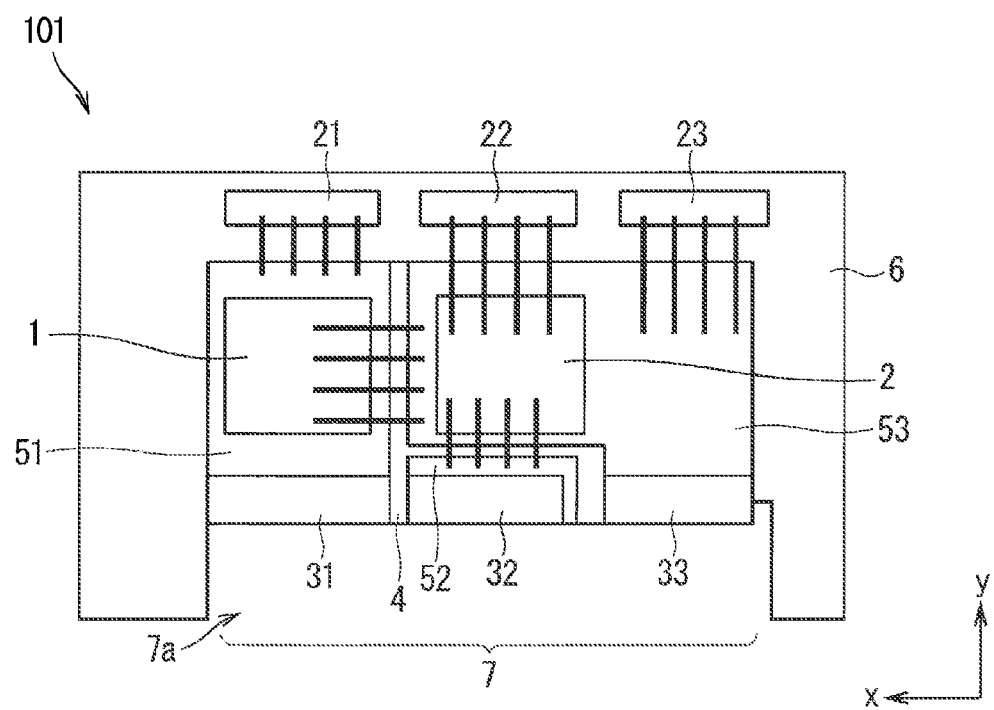
FIG. 14 is a cross-sectional view along line segment C-C of FIG. 13 of the semiconductor module according to the second preferred embodiment.
Figure 15:
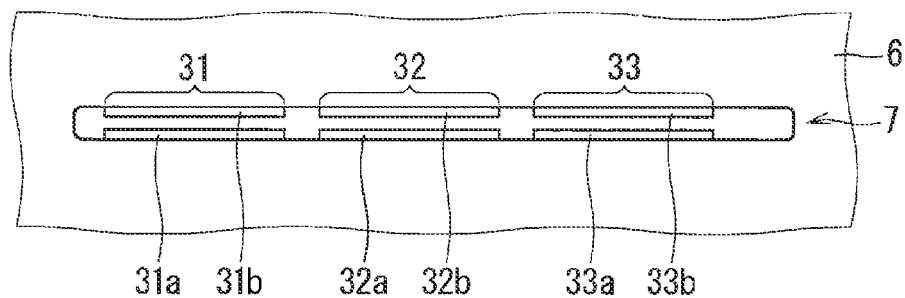
FIG. 15 is a front view of a snubber-circuit-connecting opening of the semiconductor module according to the second preferred embodiment.

FIG. 13 is a perspective view of a semiconductor module 101 in a present second preferred embodiment. FIG. 14 is a cross-sectional view of the semiconductor module 101 along line segment C-C of FIG. 13. FIG. 15 is a front view of a snubber-circuit-connecting opening 7 of the semiconductor module 101.

The semiconductor module 101 is further provided with a snubber-circuit AC electrode 33 compared with the semiconductor module 100. Since the other configurations are the same as the semiconductor module 100, the description thereof will be omitted.

The snubber-circuit AC electrode 33 is joined with a third circuit pattern 53, for example, by solder. The snubber-circuit AC electrode 33 is disposed in the interior 7a of the snubber-circuit-connecting opening 7. As shown in FIG. 15, a terminal part of the snubber-circuit AC electrode 33 has two metal plates 33a and 33b stacked with an interval provided therebetween. The cross-sectional shape of the snubber-circuit AC electrode 33 is similar to the cross-sectional shape of the snubber-circuit P electrode 31.

Figure 16:
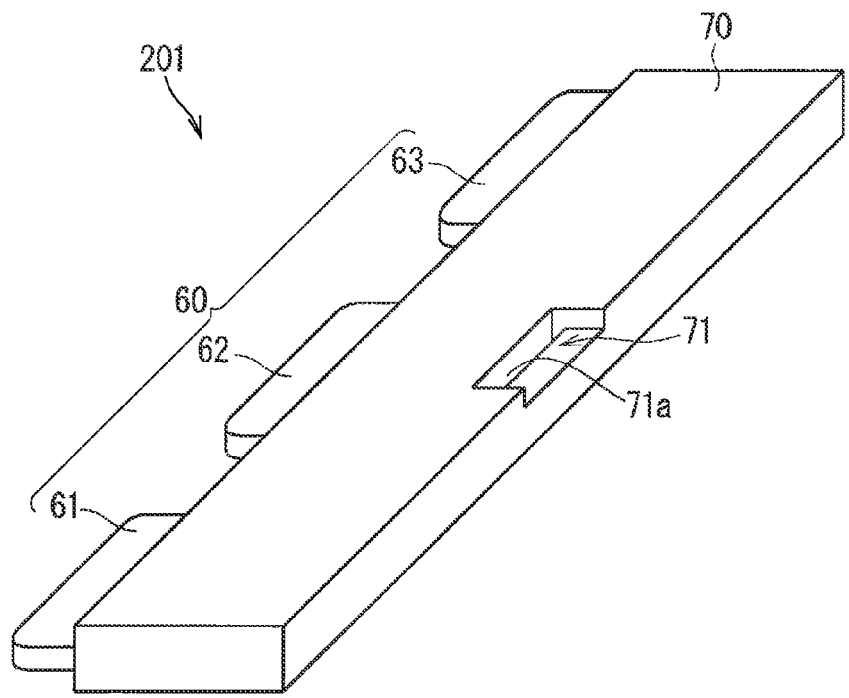
FIG. 16 is a perspective view of a snubber circuit module according to the second preferred embodiment.

FIG. 16 is a perspective view of a snubber circuit module 201 in the second preferred embodiment. The electrode terminal part 60 of the snubber circuit module 201 is provided with an AC electrode terminal 63 in addition to the P electrode terminal 61 and the N electrode terminal 62. In the electrode terminal part 60 of the snubber circuit module 201 shown in FIG. 16, the electrode terminals are disposed in the order of: the P electrode terminal 61, the N electrode terminal 62, and the AC electrode terminal 63; however, the disposing order of the electrode terminals is not limited thereto. The disposition of the P electrode terminal 61, the N electrode terminal 62, and the AC electrode terminal 63 is appropriately changed depending on the disposition of the snubber-circuit P electrode 31, the snubber-circuit N electrode 32, and the snubber-circuit AC electrode 33 provided in the semiconductor module 101.

The thickness of the AC electrode terminal 63 of the snubber circuit module 201 is designed to match the interval between the metal plates 33a and 33b of the snubber-circuit AC electrode 33.

The cross-sectional view of the semiconductor module 101 in the state in which the snubber circuit module 201 is attached thereto is similar to FIG. 6. In the state in which the snubber circuit module 201 is attached to the interior 7a, which is communicated with the snubber-circuit-connecting opening 7, the snubber circuit module 201 does not stick out from the outer surface of the outer enclosure member 6.

Figure 17:
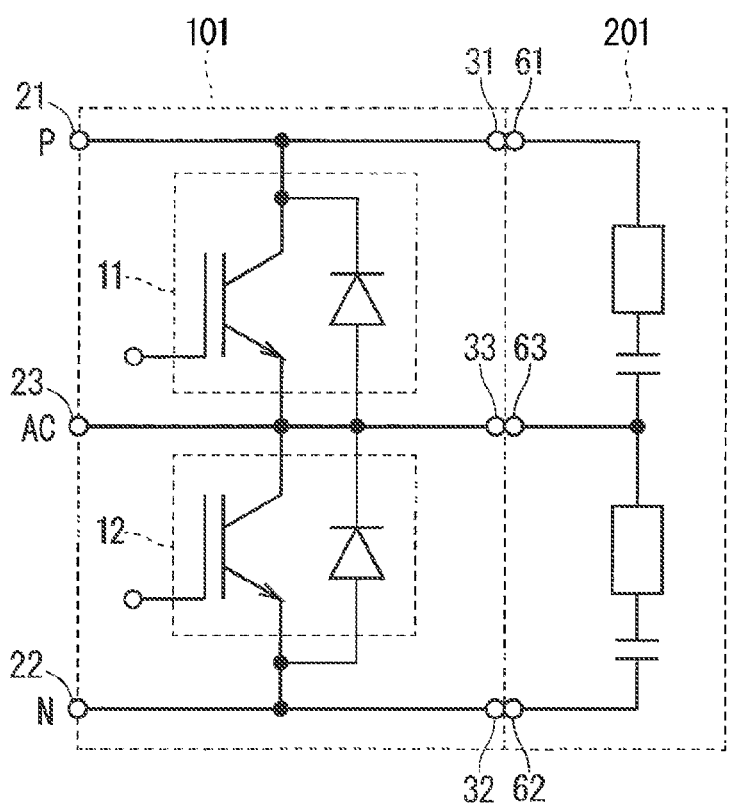
FIG. 17 is a diagram showing a first example of a circuit configuration of the semiconductor module and the snubber circuit module according to the second preferred embodiment.
Figure 18:
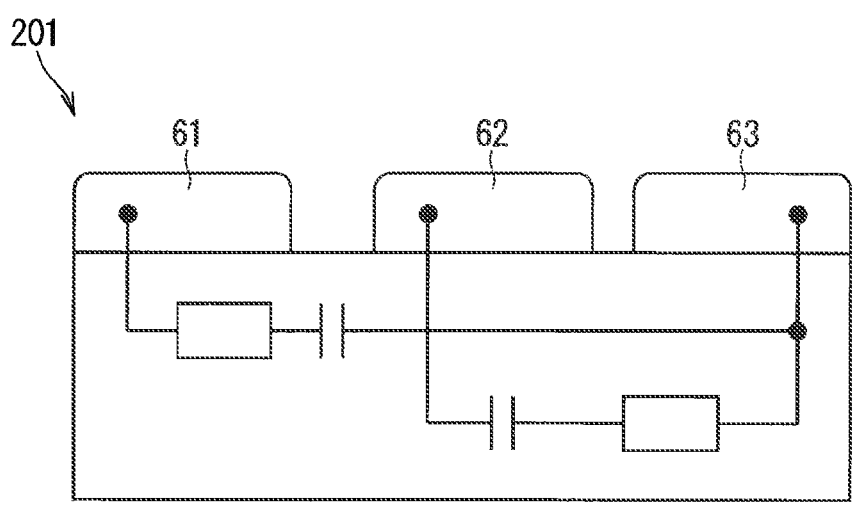
FIG. 18 is a diagram showing the first example of the circuit configuration of the snubber circuit module according to the second preferred embodiment.

FIG. 17 is a diagram showing a first example of the circuit configuration of the semiconductor module 101 and the snubber circuit module 201. FIG. 18 is a diagram showing the first example of the circuit configuration of the snubber circuit module 201. As shown in FIG. 17 and FIG. 18, in the snubber circuit module 201, a resistive element and a capacitor are connected in series between the P electrode terminal 61 and the AC electrode terminal 63, and a resistive element and a capacitor are connected in series between the AC electrode terminal 63 and the N electrode terminal 62.

FIG. 19 is a diagram showing a second example of the circuit configuration of the semiconductor module 101 and the snubber circuit module 201. FIG. 20 is a diagram showing the second example of the circuit configuration of the snubber circuit module 201. As shown in FIG. 19 and FIG. 20, a snubber circuit may be formed by combining resistive elements, capacitors, and diodes.

<Effects>

In the semiconductor module 101 in the present second preferred embodiment, the at least one semiconductor element includes the two semiconductor elements (more specifically, the semiconductor elements 11 and 12) connected in series; and the plurality of snubber circuit electrodes include the snubber-circuit P electrode 31 corresponding to the P terminal of the two semiconductor elements connected in series, the snubber-circuit N electrode 32 corresponding to the N terminal of the two semiconductor elements connected in series, and the snubber-circuit AC electrode 33 corresponding to the AC terminal of the two semiconductor elements connected in series.

Therefore, the snubber circuit can be connected not only between the P terminal and the N terminal of the semiconductor module 101, but also between the P terminal and the AC terminal and between the AC terminal and the N terminal. By virtue of this, the surge voltages generated by switching of the semiconductor elements 11 and 12 can be further suppressed.

Modification Example of Second Preferred Embodiment

Figure 21:
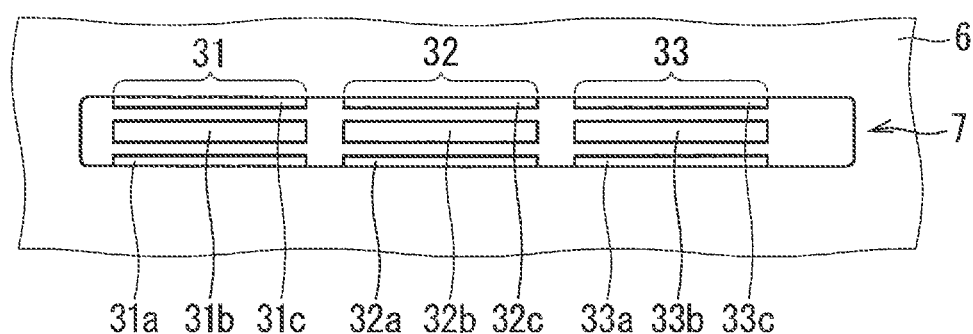
FIG. 21 is a front view of a snubber-circuit-connecting opening of a semiconductor module according to a modification example of the second preferred embodiment.

FIG. 21 is a front view of the snubber-circuit-connecting opening 7 of a semiconductor module 101A in a modification example of the second preferred embodiment. The single snubber circuit module 201 is attachable to the semiconductor module 101. On the other hand, two snubber circuit modules 201 are attachable to the semiconductor module 101A.

In the semiconductor module 101A, the terminal part of the snubber-circuit P electrode 31 has three metal plates 31a, 31b, and 31c stacked with intervals provided therebetween. Similarly, the terminal part of the snubber-circuit N electrode 32 has three metal plates 32a, 32b, and 32c stacked with intervals provided therebetween. Similarly, the terminal part of the snubber-circuit AC electrode 33 has three metal plates 33a, 33b, and 33c stacked with intervals provided therebetween. Since the other configurations of the semiconductor module 101A are the same as those of the semiconductor module 101, the description thereof will be omitted. The cross-sectional view of the semiconductor module 101A in the state in which the two snubber circuit modules 201 are attached thereto is similar to FIG. 11.

Figure 22:
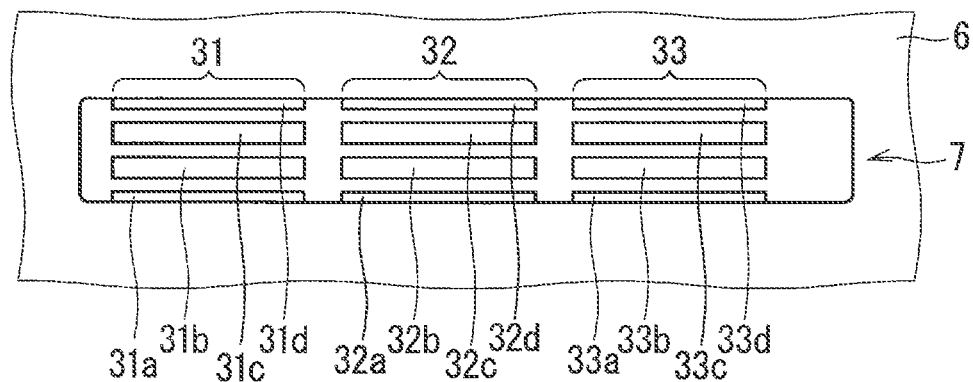
FIG. 22 is a front view of a snubber-circuit-connecting opening of the semiconductor module according to another modification example of the second preferred embodiment.

FIG. 22 is a front view of the snubber-circuit-connecting opening 7 of the semiconductor module 101A in another modification example of the second preferred embodiment. As shown in FIG. 22, the terminal part of the snubber-circuit P electrode 31 has four metal plates 31a, 31b, 31c, and 31d stacked with intervals provided therebetween. Similarly, the terminal part of the snubber-circuit N electrode 32 has four metal plates 32a, 32b, 32c, and 32d stacked with intervals provided therebetween. Similarly, the terminal part of the snubber-circuit AC electrode 33 has four metal plates 33a, 33b, 33c, and 33d stacked with intervals provided therebetween. By virtue of the configuration shown in FIG. 22, a plurality of i.e., three snubber circuit modules 201 can be attached to the snubber-circuit-connecting opening 7 at the same time.

In this manner, the number of the snubber circuit modules 201 which are attachable to the snubber-circuit-connecting opening 7 at the same time can be increased by increasing the number of the metal plates of the terminal part of the snubber-circuit P electrode 31, the terminal part of the snubber-circuit N electrode 32, and the terminal part of the snubber-circuit AC electrode 33.

Note that the configurations of the snubber circuits of the plurality of snubber circuit modules 201 which are attached to the snubber-circuit-connecting opening 7 at the same time may be mutually different.

Third Preferred Embodiment

Figure 23:
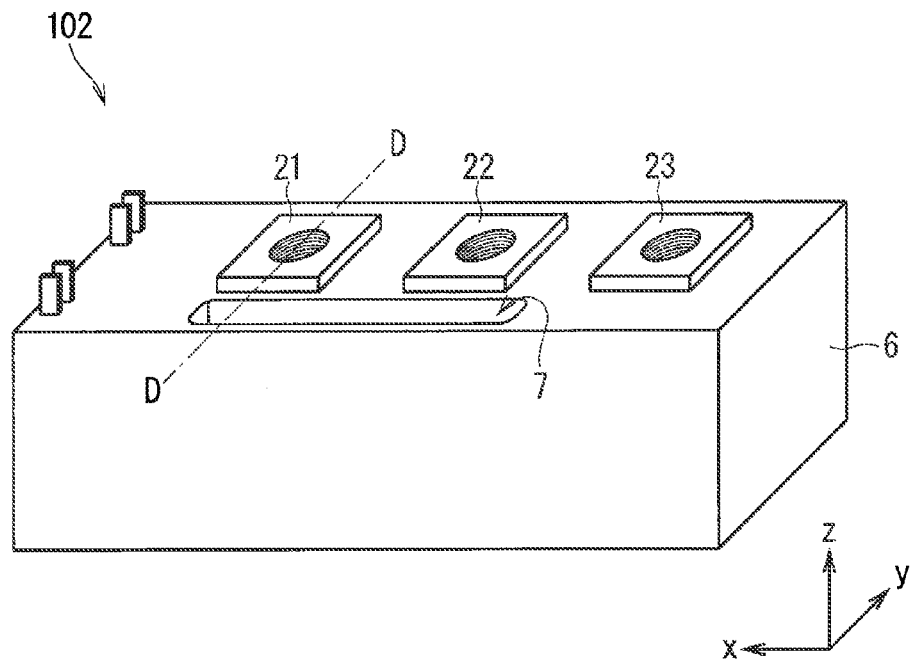
FIG. 23 is a perspective view of a semiconductor module according to a third preferred embodiment.
Figure 24:
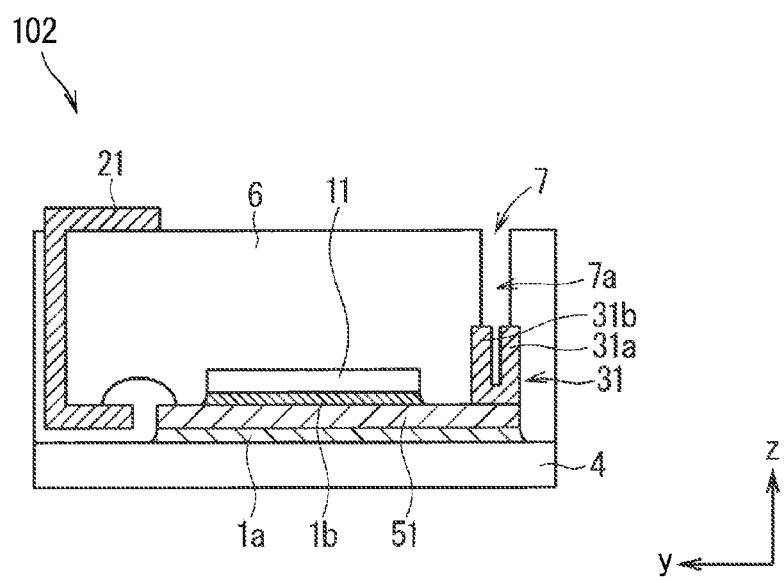
FIG. 24 is a cross-sectional view along line segment D-D in FIG. 23 of the semiconductor module according to the third preferred embodiment.
Figure 25:
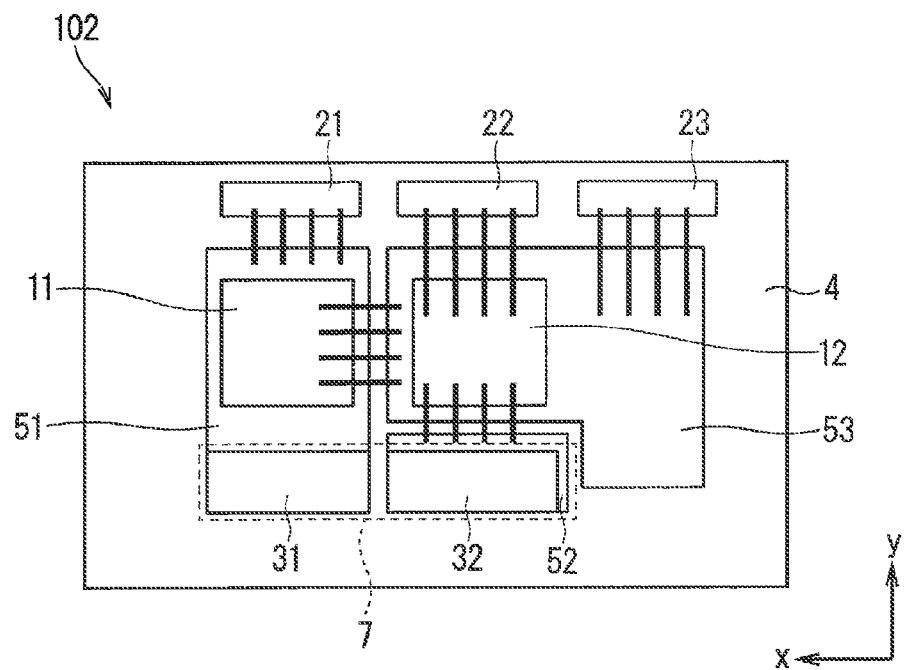
FIG. 25 is a top view of the semiconductor module according to the third preferred embodiment.

FIG. 23 is a perspective view of a semiconductor module 102 in a present third embodiment. FIG. 24 is a cross-sectional view of the semiconductor module 102 along line segment D-D in FIG. 23. FIG. 25 is a top view of the semiconductor module 102. In FIG. 25, illustration of the outer enclosure member 6 is omitted.

As shown in FIG. 23, FIG. 24, and FIG. 25, in the semiconductor module 102, the snubber-circuit-connecting opening 7 is provided in the upper surface of the outer surface of the outer enclosure member 6. Herein, the upper surface is the surface (more specifically, the surface in the z direction) opposite to the principal surface of the substrate 4 among the outer surfaces of the outer enclosure member 6.

The semiconductor module 102 is provided with a plurality of snubber-circuit electrodes as well as the semiconductor module 100. The plurality of snubber-circuit electrodes include the snubber-circuit P electrode 31 and the snubber-circuit N electrode 32. The snubber-circuit P electrode 31 is joined with the first circuit pattern 51, for example, by solder. The snubber-circuit N electrode 32 is joined with the second circuit pattern 52, for example, by solder. The snubber-circuit P electrode 31 and the snubber-circuit N electrode 32 are disposed in the interior 7a of the snubber-circuit-connecting opening 7.

The front view of the snubber-circuit-connecting opening 7 of the semiconductor module 102 is similar to FIG. 4. As shown in FIG. 4, the terminal part of the snubber-circuit P electrode 31 has the two metal plates 31a and 31b stacked with the interval provided therebetween. Similarly, the terminal part of the snubber-circuit N electrode 32 has the two metal plates 32a and 32b stacked with the interval provided therebetween. The cross-sectional shape of the snubber-circuit N electrode 32 is similar to the cross-sectional shape of the snubber-circuit P electrode 31.

In the semiconductor module 100, since the snubber-circuit-connecting opening 7 is provided in the lateral surface of the outer enclosure member 6, the snubber-circuit P electrode 31 and the snubber-circuit N electrode 32 are disposed so that the terminal parts thereof are directed toward direction horizontal to the substrate 4. On the other hand, in the semiconductor module 102, since the snubber-circuit-connecting opening 7 is provided in the upper surface of the outer enclosure member 6, the snubber-circuit P electrode 31 and the snubber-circuit N electrode 32 are disposed so that the terminal parts thereof are directed toward the perpendicular direction with respect to the substrate 4.

As shown in FIG. 24 and FIG. 25, the snubber-circuit-connecting opening 7 and the interior 7a communicated with the snubber-circuit-connecting opening 7 are disposed at the positions which are not overlapped with the semiconductor elements 11 and 12 in a planar view. Moreover, the snubber-circuit-connecting opening 7 and the interior 7a are disposed at the positions which are not overlapped with the wires, which are disposed in the semiconductor module, in the planar view. In other words, the snubber-circuit-connecting opening 7 and the interior 7a are preferred to be disposed at the positions which are not overlapped with the members excluding the circuit patterns and the snubber-circuit electrodes in the planar view. Since the other configurations of the semiconductor module 102 are the same as those of the semiconductor module 100, the description thereof will be omitted.

Figure 26:
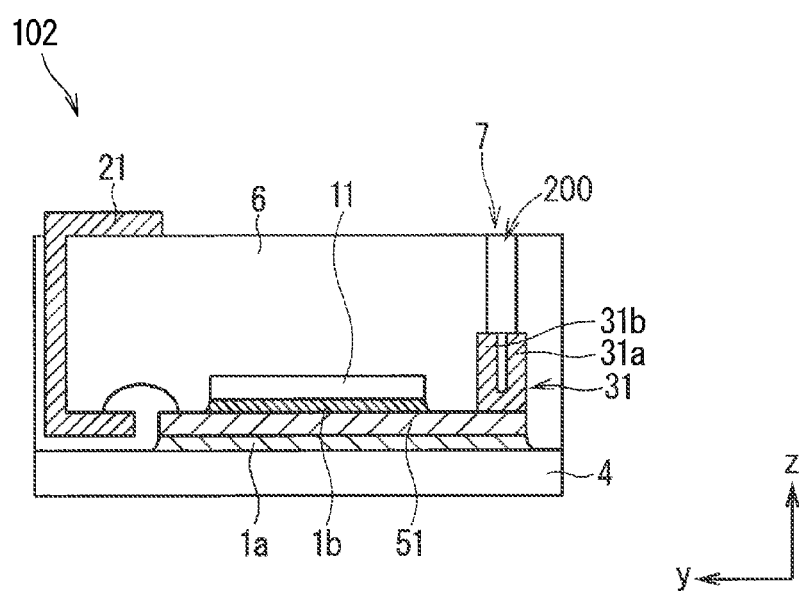
FIG. 26 is a cross-sectional view in a state in which a snubber circuit module of the semiconductor module according to the third preferred embodiment is attached.

FIG. 26 is a cross-sectional view of the semiconductor module 102 in the state 5 in which the snubber circuit module 200 is attached. The snubber circuit module 200 is attached when it is pushed into the snubber-circuit-connecting opening 7 of the semiconductor module 102. As shown in FIG. 26, the P electrode terminal 61 of the snubber circuit module 200 is inserted between the metal plates 31a and 31b, which are opposite to each other in the snubber-circuit P electrode 31, and is brought into surface-contact with each of the metal plates 31a and 31b. Similarly, the N electrode terminal 62 of the snubber circuit module 200 is inserted between the metal plates 32a and 32b, which are opposite to each other in the snubber-circuit N electrode 32, and is brought into surface-contact with each of the metal plates 32a and 32b.

As shown in FIG. 26, in the state in which the snubber circuit module 200 is attached to the interior 7a communicated with the snubber-circuit-connecting opening 7, the snubber circuit module 200 does not stick out from the outer surface of the outer enclosure member 6.

Note that, in the semiconductor module 102, the configurations of the snubber-circuit P electrode 31 and the snubber-circuit N electrode 32 may be changed like FIG. 10 or FIG. 12 so that the plurality of snubber circuit modules 200 may be attached to the semiconductor module 102.

<Effects>

The snubber-circuit-connecting opening 7 of the semiconductor module 102 in the present third preferred embodiment is provided in the surface opposite to the principal surface of the substrate 4 among the outer surfaces of the outer enclosure member 6. Therefore, even if another device, etc. are disposed in the lateral surface side of the semiconductor module 102, the snubber circuit module 200 can be attached/detached to/from the upper surface of the semiconductor module 102.

Fourth Preferred Embodiment

Figure 27:
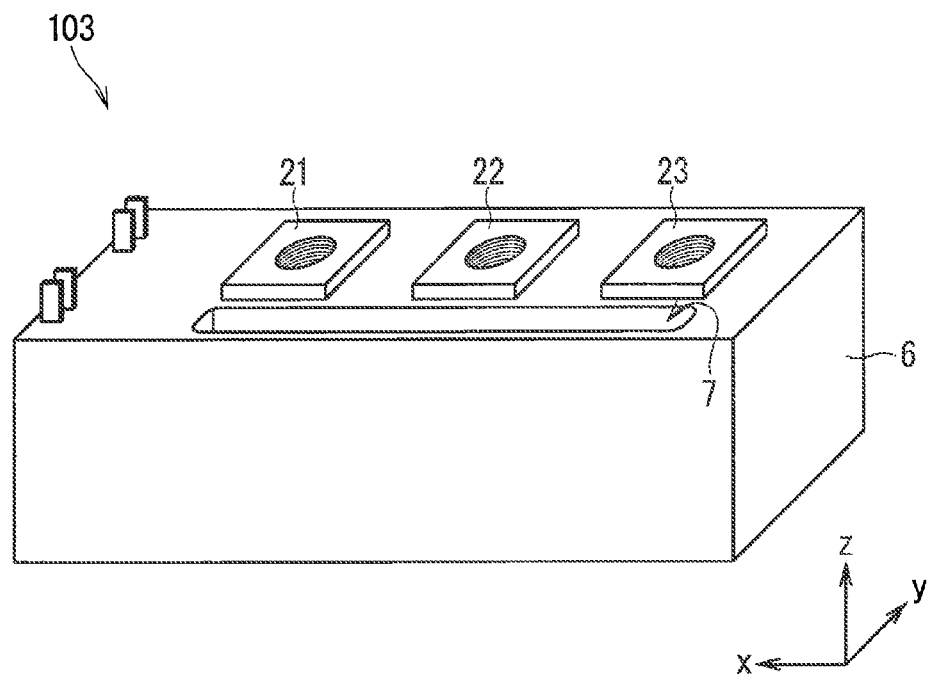
FIG. 27 is a perspective view of a semiconductor module according to a fourth preferred embodiment.
Figure 28:
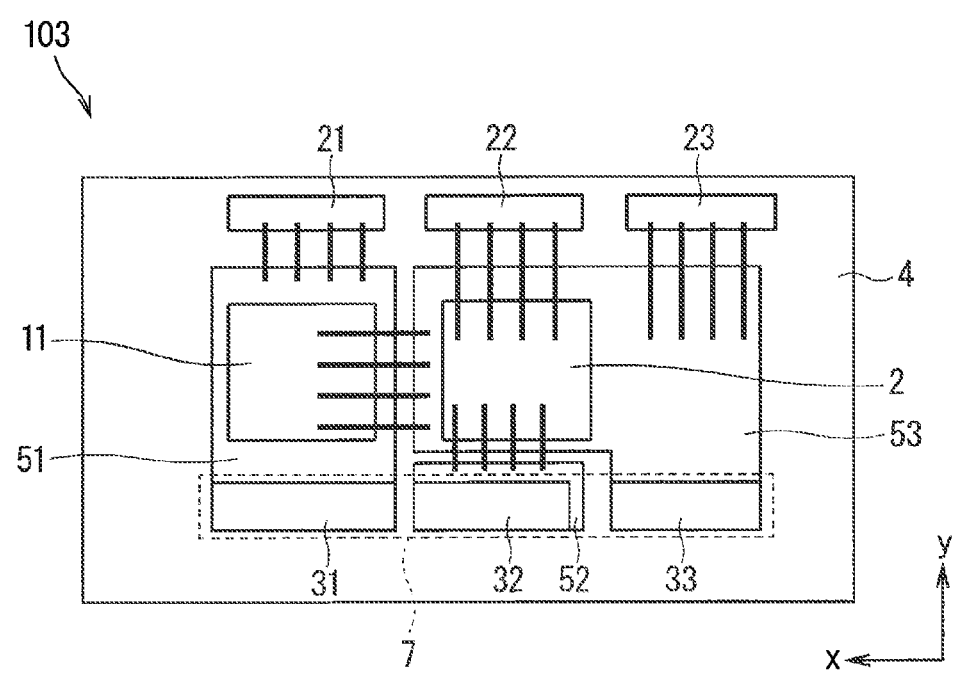
FIG. 28 is a top view of the semiconductor module according to the fourth preferred embodiment.

FIG. 27 is a perspective view of a semiconductor module 103 in a present fourth preferred embodiment. FIG. 28 is a top view of the semiconductor module 103. Note that, in FIG. 28, illustration of the outer enclosure member 6 is omitted.

The semiconductor module 103 is further provided with the snubber-circuit AC electrode 33 compared with the semiconductor module 102. Since the other configurations are the same as those of the semiconductor module 102, the description thereof will be omitted.

The snubber-circuit AC electrode 33 is joined with the third circuit pattern 53, for example, by solder. The snubber-circuit AC electrode 33 is disposed in the interior 7a of the snubber-circuit-connecting opening 7.

The front view of the snubber-circuit-connecting opening 7 in the semiconductor module 103 is similar to FIG. 15. As shown in FIG. 15, the terminal part of the snubber-circuit AC electrode 33 has the two metal plates 33a and 33b stacked with the interval provided therebetween. The cross-sectional shape of the snubber-circuit AC electrode 33 is similar to the cross-sectional shape of the snubber-circuit P electrode 31.

The snubber circuit module 201 described in the second preferred embodiment can be attached/detached to/from the semiconductor module 103 in the present fourth preferred embodiment. Note that, in the semiconductor module 103, the configurations of the snubber-circuit P electrode 31, the snubber-circuit N electrode 32, and the snubber-circuit AC electrode 33 may be changed like FIG. 21 or FIG. 22 so that the plurality of snubber circuit modules 201 can be attached to the semiconductor module 103.

Fifth Preferred Embodiment

Figure 29:
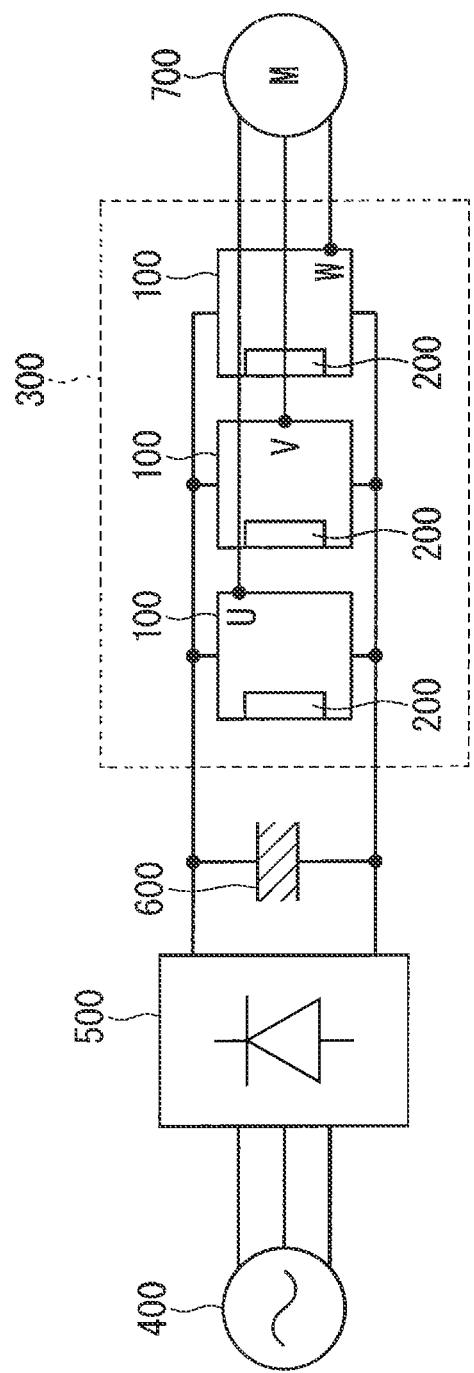
FIG. 29 is a diagram showing a configuration of an electric power device according to a fifth preferred embodiment.

FIG. 29 is a diagram showing a configuration of an electric power device in a present fifth preferred embodiment. The electric power device in the present fifth 5 preferred embodiment is provided with a semiconductor device 300, a load 700, and an electric power source 400 of the load 700. The semiconductor device is provided with three semiconductor modules 100. Snubber circuit modules 200 are attached to the semiconductor modules 100, respectively. The semiconductor device is an inverter circuit, and the three semiconductor modules 100 correspond to a U phase, a V phase, and a W phase, respectively.

As shown in FIG. 29, the load 700 is a motor. A rectifier circuit 500 and a smoothing capacitor 600 are connected between the electric power source 400 and the semiconductor device 300.

Note that, instead of the semiconductor modules 100, the semiconductor modules 101, 102, and/or 103 may be disposed. The snubber circuit modules 201 may be attached to the semiconductor modules 101 and 103.

<Effects>

The electric power device in the present fifth preferred embodiment is provided with the semiconductor device 300, the load 700, and the electric power source 400 of the load 700, and the semiconductor device 300 converts the electric power of the electric power source 400 and drives the load 700. The snubber circuit modules 200 can be connected in the vicinities of the semiconductor modules 100. Therefore, even in a case in which the semiconductor modules 100 are incorporated in the electric power device to convert the electric power, the surge voltages contained in the converted electric power can be suppressed.

Note that, in the first preferred embodiment to the fifth preferred embodiment, the semiconductor elements 11 and 12 may be semiconductor elements containing wide-band-gap semiconductor. The wide-band-gap semiconductor is SiC, GaN, diamond, etc. If the semiconductor elements 11 and 12 contain the wide-band-gap semiconductor, generation of surge voltages become notable since large currents and high voltages can be switched at higher speed. Therefore, generation of the surge voltages can be more effectively suppressed by employing, for the semiconductor modules, the configurations described in the first to fifth preferred embodiments.

Note that the present invention can freely combine the embodiments and/or appropriately modify and/or omit the embodiments within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   at least one semiconductor element;
   a circuit pattern disposed on a substrate and joined with a main electrode of said at least one semiconductor element;
   an outer enclosure member enclosing at least said at least one semiconductor element and a surface of said substrate in a side of said circuit pattern; and
   a snubber-circuit-connecting opening provided in an outer surface of said outer enclosure member, wherein
   at least one snubber circuit module is attachable/detachable to/from an interior communicated with said snubber-circuit-connecting opening;
   a plurality of snubber-circuit electrodes for electrically connecting with said at least one snubber circuit module are joined with said circuit pattern;
   said plurality of snubber-circuit electrodes are disposed in said interior of said snubber-circuit-connecting opening;
   in a state that said snubber circuit module is attached in said interior of said snubber-circuit-connecting opening, said snubber circuit module does not stick out from an outer surface of said outer enclosure member;
   said plurality of snubber-circuit electrodes are in surface-contact with electrodes in a side of said snubber circuit module, respectively; and
   said snubber-circuit-connecting opening and said interior are not overlapped with said at least one semiconductor element in a planar view.

2. The semiconductor module according to claim 1, wherein
   said snubber-circuit-connecting opening is provided in a lateral surface with respect to a principal surface of said substrate among the outer surfaces of said outer enclosure member.

3. The semiconductor module according to claim 1, wherein
   said snubber-circuit-connecting opening is provided in a surface opposite to a principal surface of said substrate among the outer surfaces of said outer enclosure member.

4. The semiconductor module according to claim 1, wherein
   said at least one snubber circuit module includes a plurality of said snubber circuit modules,
   the plurality of said snubber circuit modules can be attached to said snubber-circuit-connecting opening at the same time; and
   the plurality of said snubber circuit modules are connected in parallel mutually with respect to said plurality of snubber-circuit electrodes.

5. The semiconductor module according to claim 1, wherein a terminal part of each of said plurality of snubber-circuit electrodes has a plurality of metal plates stacked with an interval; and an electrode terminal in the side of said snubber circuit module is inserted and brought into surface-contact between said plurality of metal plates.

6. The semiconductor module according to claim 1, wherein said at least one semiconductor element includes two semiconductor elements connected in series; and said plurality of snubber-circuit electrodes include at least two of: a snubber-circuit P electrode corresponding to a P terminal of said two semiconductor elements connected in series, a snubber-circuit N electrode corresponding to an N terminal of said two semiconductor elements connected in series, and a snubber-circuit AC electrode corresponding to an AC terminal of said two semiconductor elements connected in series.

7. The semiconductor module according to claim 1, wherein said at least one semiconductor element contains wide-band-gap semiconductor.

8. A semiconductor device comprising:

the semiconductor module according to claim 1 and said at least one snubber circuit module attachable/detachable to/from said snubber-circuit-connecting opening of the semiconductor module.

9. The semiconductor device according to claim 8, wherein a cutout is provided on an exterior of said at least one snubber circuit module; and said cutout is utilized when said at least one snubber circuit module is pulled out from said snubber-circuit-connecting opening.

10. An electric power device comprising:

at least one of the semiconductor device according to claim 8, a load, and an electric power source of said load; wherein said semiconductor device converts electric power of said electric power source and drives said load.

* * * * *